United States Patent [19]
Grenouilloux et al.

[11] Patent Number: 5,798,288
[45] Date of Patent: Aug. 25, 1998

[54] PROCESS FOR THE PRODUCTION OF RANDOM ACCESS MEMORIES OF THE PRELOADING STATIC TYPE

[75] Inventors: Charles Grenouilloux, Montreuil; Francis Joffre, Bures-sur-Yvette, both of France

[73] Assignee: Commissariat a l'Energie Atomique, Paris, France

[21] Appl. No.: 521,864

[22] Filed: Aug. 31, 1995

[30] Foreign Application Priority Data

Sep. 2, 1994 [FR] France .................................. 94 10572

[51] Int. Cl.$^6$ ............................................. H01L 21/8234
[52] U.S. Cl. ...................... 438/238; 438/308; 438/795; 438/798
[58] Field of Search ................................ 438/238, 795, 438/798, 308

[56] References Cited

U.S. PATENT DOCUMENTS 5,053,848 10/1991 Houston et al. ........................ 438/238

*Primary Examiner*—Charles L. Bowers, Jr.
*Assistant Examiner*—Lynne A. Gurley
*Attorney, Agent, or Firm*—Pearne, Gordon, McCoy & Granger LLP

[57] ABSTRACT

The present invention relates to a process for the production of a random access memory of the preloading static type, in which use is made of a static random access memory constituted by MOS transistors formed from the memory flip-flop array and in which a particle or photon beam is applied to the said MOS transistors in such a way that the accumulated dose received exceeds a predetermined value.

6 Claims, 1 Drawing Sheet

PROCESS FOR THE PRODUCTION OF RANDOM ACCESS MEMORIES OF THE PRELOADING STATIC TYPE

DESCRIPTION

1. Technical Field

The present invention relates to a process for the production of random access memories of the preloading static type from static random access memories.

2. Prior Art

It can be of interest to have memories with a predefined content of energizing. This type of memory can e.g. be used for robots or automations. They then contain a program, a configuration or parameters which can be altered by teleloading or directly by the system computer. The advantage is that in the case of teleloading problems, configuration or parametrizing errors, it still remains possible to deenergize and then energize. The original content is then again present in the memory. This reinitialization of the memory can be the responsibility of a watchdog system. Thus, this type of memory makes it possible to increase the reliability of systems giving the possibility of finding at any time and in a simple manner the original memory content.

At present, four types of memories are able to have their content altered.

Fusible PROM's (read only memories programmable once by the user). It is still possible to enter in said components when they are programmed, provided that there are still unprogrammed locations in the circuit. However, said entry is irreversible. It is also necessary to have on the circuit the programming system, which complicates the design of the systems.

EEPROM's (memories electrically erasable and programmable by the user) and battery RAM's (volatile memories kept energized in order to retain the data). The components of this type of memory can be subject to a content alteration. However, in the case of problems, it is not possible to find the original content.

NOVRAM's (non-volatile RAM's). They combine an EEPROM and a buffer RAM in the same package and can be used in the same way as preloading RAM's. However, they only have a small memory capacity and their integration density will always be smaller than RAM's, in view of the fact that it is necessary to have two memory arrays.

It can be seen that there is no component which can be substituted for a preloading RAM. Only more complex systems comprising a ROM, a RAM and a logic circuit could make it possible to ensure the same function.

The object of the invention is therefore to obtain a random access memory of the preloading static type starting with a volatile memory.

DESCRIPTION OF THE INVENTION

Therefore the invention proposes a process for the production of a random access memory of the static preloading type, characterized in that use is made of a random access memory of the static type formed by MOS transistors constituted by the memory flip-flop array and in that a particle or photon beam is applied to these MOS transistors in such a way that the accumulated dose received exceeds a predetermined value.

In order to obtain a random access memory of the static preloading type using gamma radiation, the accumulated dose received must in general exceed several dozen kilorad (threshold variable as a function of the manufacturer).

DETAILED DESCRIPTION OF THE PRINCIPLE AND AN EMBODIMENT

A MOS (metal oxide silicon) transistor deteriorates more rapidly under the effect of particle or photon beams when it is conductive or on. The deterioration with such components leads to a deviation or drift of its control voltage (Vgs), which leads to the situation where such a transistor cannot be switched off following an adequate exposure.

Static volatile CMOS memories are constituted by flip-flops, which are themselves formed by transistors belonging to this family. If a bit is positioned at 0 or 1 in one of the components when it is exposed to a particle or photon beam the elementary transistors of a memory flip-flop, which are on, drift more rapidly towards that state than those which are off and the flip-flop is then fixed in the state which it had during its exposure.

On continuing to expose it to the said beam, the flip-flop remains fixed in this state until the transistors which were off deteriorate to such an extent that it is no longer possible to maintain them off.

Thus, if in a volatile memory the desired content is maintained while the latter is exposed for a sufficiently long time to a particle or photon beam, it is possible to obtain a preloading memory. The reduction of the control threshold in saturation (Vgs) of the transistors, which is faster when the transistors exposed to the beam are off, destabilizes the flip-flops and has the effect of prepositioning them on energization with the content which they had during said irradiation. However, it is still possible to alter their content.

For a memory component to allow the implementation of the process according to the invention, it is necessary for the transistors, which constitute the decoding and addressing functions of the memory array, to drift much less rapidly than those of the memory cells.

Figure 1:
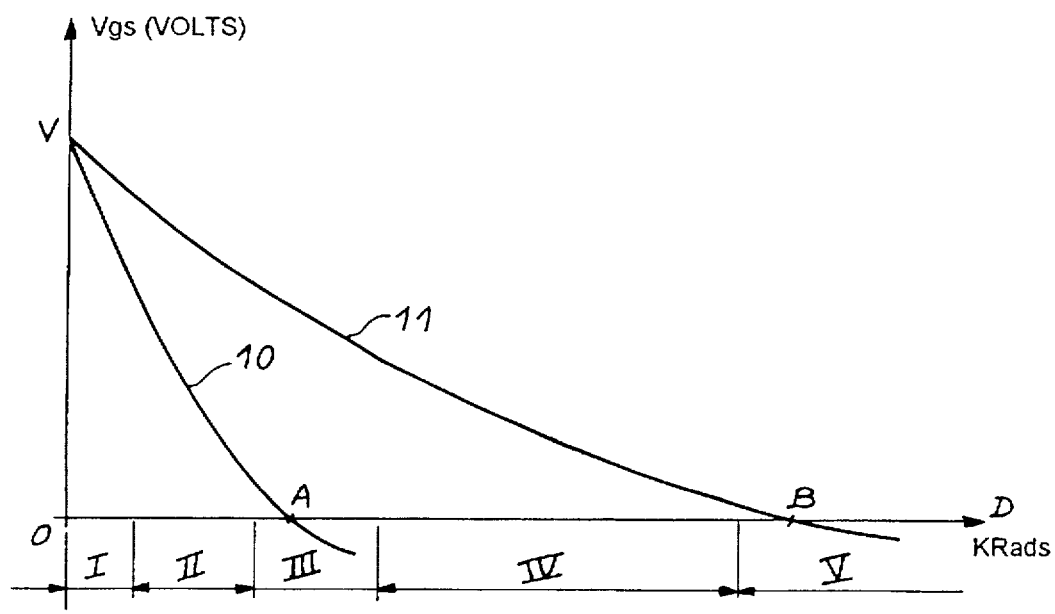
FIG. 1 illustrates the operation of the process according to the invention.

FIG. 1 illustrates the main phases of the life of a volatile memory exposed to a particle or photon beam as a function of the evolution of the control voltage of type N MOS elementary transistors. For a type P transistor, the configuration of the curve is identical, but with a negative starting point.

Vgs is the voltage passing the MOS transistor from the on to the off state. The following, different zones occur:

| zone I:   | RAM            |
|-----------|----------------|
| zone II:  | preloading RAM |
| zone III: | semi-fixed     |
| zone IV:  | ROM            |
| zone V:   | unusable       |

Curve 10 corresponds to an on transistor and curve 11 to an off transistor.

For a complex component (several transistors being combined in order to e.g. form a memory), e.g. of the UMC memory type, with a gamma ray dose rate of 5 krad/h, the following values are obtained:

| | |
|---|---|
| limit zone I - | zone II #63 krad |
| limit zone III - | zone IV #630 krad |
| limit zone IV - | zone V > 1500 krad |
| V #2 V | |

It is pointed out that the penetration depth in the material, linked with the energy involved, may make it necessary to open up the components during their exposure.

According to the process of the invention, in order to obtain a preloading RAM, it is necessary to expose said memory at the outset to a particle or photon beam when it contains the data which it is wished to impregnate or fix there.

Figure 2:
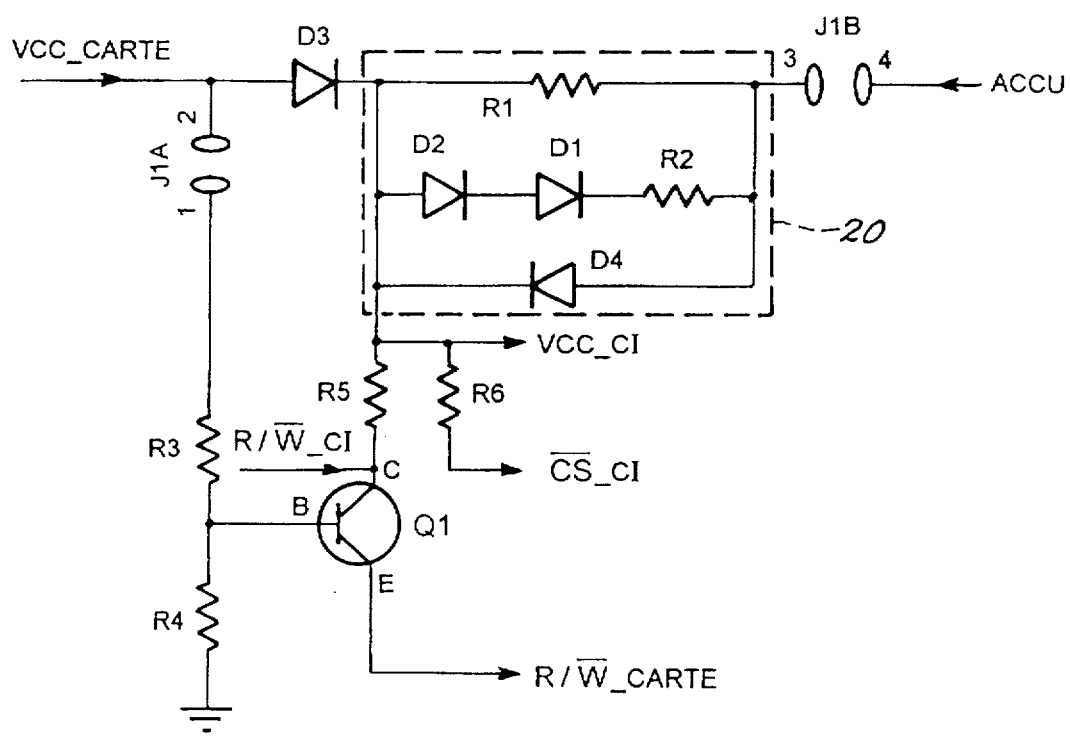
FIG. 2 shows a circuit making it possible to perform the process of the invention.

FIG. 2 illustrates an example of a card making it possible to perform said process. The memories are installed on an accumulator-equipped support so as to permit the loading and saving of its content. They are then preloaded with the desired content and then exposed to a particle or photon beam. The dose rate and the dose to which they are exposed in order to be usable in volatile memories with prepositioning on energizing, is dependent on the production process used. Therefore this parameter is dependent on the components used and determination thereof is only possible through a preliminary test.

This support or card has a transistor Q1 polarized by means of resistors R3, R4 and R5.

Jumper wires J1A and J1B are provided between the resistor R3 and the card power supply Vcc__ card and between the accumulator ACCU and a charging circuit 20 connected to the resistor R5. A diode D3 is connected between the card supply voltage and said charging circuit 20 and prevents the accumulator from supplying the remainder of the card.

The following signals can be obtained:

Vcc__CI : supply of the memory circuit at the common point of the resistor R5 and circuit 20;

$\overline{CS}$__CI : Chip-Select of the memory circuit at the end of a resistor R6 connected to the preceding common point, R6 being a resistor for bringing the Chip-Select to a high level to avoid the memory not being selected;

R /$\overline{W}$__CI : writing/reading of the memory circuit on the collector of the transistor Q1;

R/$\overline{W}$__ card : writing/reading of the card on the emitter of the transistor Q1.

The charging circuit 20 has two speeds:

at constant voltage by means of the diodes D1, D2 and the resistor R2;

at constant current due to the resistor R1.

Switching from one to the other takes place automatically (threshold of 4.08 V at the terminals of the two diodes D1 and D2). The diode D4 makes it possible to supply the memory circuit when there is no longer a supply on the card.

The circuit illustrated in FIG. 2 fulfills different functions. Firstly it keeps the memory live in such a way that its content is saved once the power supply is interrupted. The charging circuit automatically charges the accumulator as soon as the support is connected to a power supply. The polarization system ensures that the memory is not selected in untimely manner in writing. This system is completed by a jumper wire, whose absence prevents the writing of the memory.

In an embodiment:
R1=3.3K$\Omega$
R2=39$\Omega$
R3=R4=47K$\Omega$
R5=4.7K$\Omega$
R6=100K$\Omega$
D1=D2=D3=diode 1N4148
D4=diode BAT 48
Q1 32 transistor BC549B It would obviously be possible to use other circuits for performing the process of the invention.

Thus, the memory to be programmed can be placed on a microcontroller card, whose function is to maintain in said RAM the content which it is wished to store there. It is then possible to directly control the impregnation state of the memory during its exposure.

The invention makes available memory circuits able to contain alterable, resident programs or data.

The feasibility of the process according to the invention has been demonstrated for several memory models exposed to cobalt 60 gamma radiation.

It is possible to envisage producing RAM's, which would have characteristics enabling their use with this process and e.g. using different technologies.

We claim:

1. Process for the production of a preloading static random access memory, comprising the steps of exposing radiation to a static random access memory formed from MOS transistors constituting a memory flip-flop array; measuring the accumulated radiation dose received by said MOS transistors; and regulating the accumulated radiation dose to be greater than a first value, but less than a second value, wherein said first and second values correspond to progressive fixation of the memory flipflops.

2. Process according to claim 1, wherein gamma radiation is used, and the first value of accumulated dose is greater than ten kilorad.

3. Process according to claim 1, further comprising the steps of placing the static random access memory on an accumulator-equipped support that loads and saves the memory's content; preloading the memory with a desired content; and regulating the exposure rate and amount of radiation based on a preliminary test to produce a preloading static random access memory.

4. Process according to claim 3, wherein the support keeps the memory energized so that the memory's content is saved when the power supply is interrupted; a charging circuit automatically charges the accumulator as soon as the support is connected to a power supply; a polarization system prevents selection of the memory during writing; and a jumper wire prevents, by the wire's absence, writing of the memory.

5. Process according to claim 1, further comprising the step of installing the static random access memory on a microcontroller card, said microcontroller card maintains the content of the static random access memory and directly controls the state of said memory during the radiation exposure.

6. Process according to claim 1, further comprising the steps of turning selected MOS transistors on and maintaining the remaining MOS transistors off; selecting the first accumulated radiation dose to correspond to a value that destabalizes the on MOS transistors to be of the preloading type and selecting the second accumulated radiation dose to correspond to a value that maintains the writing faculties of the on MOS transistors and maintains the stability of the off MOS transistors.

* * * * *

UNITED STATES PATENT AND TRADEMARK OFFICE
CERTIFICATE OF CORRECTION

PATENT NO. : 5,798,288   Page 1 of 2
DATED : August 25, 1998
INVENTOR(S) : Grenouilloux et al.

It is certified that error appears in the above-identified patent and that said Letters Patent is hereby corrected as shown below:

On the title page:  , under [56] References Cited, please insert:

--U.S. PATENT DOCUMENTS 4,418,402 11/1983  Heagerty et al.

OTHER PUBLICATIONS

IEEE TRANSACTIONS ON NUCLEAR SCIENCE, Vol. 33, No. 6, December 1986, New York, US, pgs. 1484-1486, Brucker et al., "TRANSIENT IMPRINT MEMORY EFFECT IN MOS MEMORIES".

ELECTRONICS DE 1984 A 1985: ELECTRONICS WEEK, Vol. 55, No. 23, November 1982, New York, US, pgs. 137-139, Davis et al., "HIGH PERFORMANCE MOS RESISTS RADIATION".

UNITED STATES PATENT AND TRADEMARK OFFICE
CERTIFICATE OF CORRECTION

PATENT NO.   : 5,798,288
DATED        : August 25, 1998
INVENTOR(S)  : Grenouilloux et al.

It is certified that error appears in the above-identified patent and that said Letters Patent is hereby corrected as shown below:

ELECTRONICS DE 1984 A 1985: ELECTRONICS WEEK, Vol. 58, No. 32, August 1985, New York, US, pgs. 32f/h-32j&l, Pearson, "NEW RAD-HARD TECHNOLOGY ADDS OPTIONS FOR SYSTEM DESIGNERS".

IBM TECHNICAL DISCLOSURE BULLETIN, Vol. 27, No. 11, April 1985, New York, US, page 6368, "BATTERY BACKUP CIRCUIT FOR CMOS RAM".--

Column 1, line 14, delete "automations" and insert --automatons--.

Signed and Sealed this

Eighth Day of December, 1998

*Attest:*

BRUCE LEHMAN

*Attesting Officer*      *Commissioner of Patents and Trademarks*